(12) United States Patent
Kossor

(10) Patent No.: US 6,448,867 B1
(45) Date of Patent: Sep. 10, 2002

(54) HIGH FREQUENCY VOLTAGE VARIABLE ATTENUATOR

(75) Inventor: Michael Gordon Kossor, Kenilworth, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/625,281

(22) Filed: Jul. 25, 2000

(51) Int. Cl.[7] .................................................. H01P 1/22
(52) U.S. Cl. .................................... 333/81 A; 333/81 R
(58) Field of Search ............................. 333/81 A, 81 R

(56) References Cited

U.S. PATENT DOCUMENTS 3,713,037 A * 1/1973 Hopfer ..................... 333/81 A
3,859,609 A * 1/1975 Couvillon et al. ......... 333/81 A
4,754,240 A * 6/1988 Marconi .................... 333/81 A
5,521,560 A * 5/1996 Burns et al. ............... 333/81 A

OTHER PUBLICATIONS

Hewlett Packard Application Note 1048, "A Low–Cost Surface Mount PIN Diode π Attenuator," Seminar 1973.

* cited by examiner

*Primary Examiner*—Robert Pascal
*Assistant Examiner*—Stephen E. Jones
(74) *Attorney, Agent, or Firm*—Harness, Dickey & Pierce, P.L.C.

(57) ABSTRACT

The attenuator has a microstrip network connected between an input and an output of the attenuator, and the microstrip network has a different impedance than a remainder of the attenuator.

13 Claims, 3 Drawing Sheets

HIGH FREQUENCY VOLTAGE VARIABLE ATTENUATOR

BACKGROUND OF THE INVENTION

1. Field of the Invention

The invention relates to voltage variable attenuators, and more particularly, to high frequency, voltage variable pi attenuators.

2. Description of Related Art

Analog attenuators find application in RF and microwave networks, and particularly in commercial application such as cellular telephone, personal communication networks, wireless local area networks, portable radios, etc. FIG. 1 illustrates a basic, prior art, pi fixed attenuator. As shown, the basic pi fixed attenuator includes a series resistance R1 connected between an input 2 and an output 4 of the attenuator, a first shunt resistance R2 connected between the input 2 and ground, and a second shunt resistance connected between the output 4 and ground. The series resistance R1 and the first and second shunt resistances R2 and R3 are set to achieve some desired value of the attenuation while simultaneously providing an input and output impedance which matches the characteristic impedance Zo of the system of which the attenuator forms a part.

However, the basic pi attenuator of FIG. 1 is a fixed attenuator providing a fixed attenuation. FIG. 2 illustrates another, prior art, pi attenuator that provides for variable attenuation. The attenuator of FIG. 2 is commonly referred to as a four diode pi attenuator. As shown, an anode-to-anode series connection of first and second diodes D1 and D2 have replaced the series resistor $1 in FIG. 1, a first capacitor C1 is connected between the input 2 and the cathode of the first diode D1, and a second capacitor C2 is connected between the cathode of the second diode DI and the output 4.

A third diode D3 is connected in series with a fourth capacitor C4 between the cathode of the first diode D1 and ground. A fourth diode D4 is connected in series with a fifth capacitor C5 between the cathode of the second diode D2 and ground. A fourth resistor R4 and a fifth resistor R5 are connected in series between the anodes of the third and fourth diodes D3 and D4, and a sixth resistor R6 is connected to a common node of the fourth and fifth resistors R4 and R5 and a fixed voltage source VREF (e.g., 5 volts).

As further shown, a seventh resistor R7 is connected in series with a third capacitor C3 between ground and the anodes of the first and second diodes D1 and D2, and a variable control voltage Vc is applied to the common node of the seventh resistor R7 and the third capacitor C3. The control voltage Vc applied to the attenuator controls the amount of attenuation. Below frequencies of 1 GHz, it is not uncommon to construct the attenuator of FIG. 2 to provide a 15 dB attenuation range with input and output return loss of less than –20 dB over the entire adjustment range. However, performance begins to degrade as signal frequencies are increased above 1 GHz. FIG. 3 illustrates the insertion loss, input return loss (S11) and output return loss (S22) of the attenuator of FIG. 2 operating over the 1.93–1.99 GHz frequency band.

Referring to FIG. 3, note that a signal attenuation range from –1.5 dB to –16.5 dB mean insertion loss is still achieved when measured over the frequency band from 1.93 GHz to 1.99 GHz as the control voltage Vc is varied from 14.0 VDC to 1.8 VDC. However, the input and output return loss (i.e. impedance matching), is far worse than the –20 dB return loss that is typical at lower frequencies. Additionally, the insertion loss flatness over the operation frequency band also worsens as the operating frequency is increased. Typical values of insertion loss flatness as a function of frequency ranged from 0.14 dB to 0.47 dB as the attenuator was varied over the 15 dB attenuation range while operating at signal frequencies from 1.93 GHz to 1.99 GHz. This level of performance may be acceptable for some applications but is completely unacceptable for critical applications such as high linearity, feed forward RF amplifiers designs operating in the 1.93 GHz to the 1.99 GHz frequency band.

The inventor attempted to improve the high frequency performance, particularly, the impedance matching using known techniques. For example, the values of the seventh, fourth and fifth resistors R7, R4 and R5 were varied, but did not successfully improve performance.

The inventor also tried connecting a microstrip network to the input 2 and to the output 4 of the attenuator, but this also failed to improve performance. As is known, the elements of FIG. 2 are connected by microstrip conductors having an impedance matching the desired characteristic impedance Zo of the attenuator (e.g., 50 Ohms for communication systems or 75 Ohms for video and computer network systems). Because the attenuator of FIG. 2 failed to achieve the desired characteristic impedance at higher frequencies, the inventor tried to alter the input and output impedances and achieve matching by connecting microstrip conductors (also referred to as a microstrip networks) to the input 2 and the output 4, respectively. However, this technique assumes in part that the input and output impedances will be substantially independently affected by the microstrip networks connected to the input 2 and the output 4. Unfortunately, for the high frequency operating range, the microstrip network connected to the input 2 affected the output impedance such that impedance matching at the output 4 was not achieved, and the microstrip network connected to the output 4 affected the input impedance such that impedance matching at the input 2 was not achieved. As a result, impedance matching was not achieved, and the input and output return loss was unacceptable.

SUMMARY OF THE INVENTION

Having failed to improve the impedance matching of the attenuator in FIG. 2 using conventional techniques, the inventor went on to discover that both the input and output impedances of a pi attenuator (of which the attenuator in FIG. 2 is but one example) could be simultaneously improved by internally connecting a microstrip network, which has a different impedance than the remainder of the attenuator, between the input and the output of the attenuators. More specifically, the inventor found that by connecting a microstrip conductor, which has a particular electrical length and a different width (i.e., different impedance) than the remainder of the microstrip conductors in the attenuator, between the input and the output, impedance matching at high frequencies could be achieved. In doing so, the inventor violated standard design techniques such as minimizing the electrical length of microstrip conductors in the attenuator and maintaining the impedance of the microstrip conductors in the attenuator uniform.

BRIEF DESCRIPTION OF THE DRAWINGS

The present invention will become more fully understood from the detailed description given hereinbelow and the accompanying drawings which are given by way of illustration only, wherein like reference numerals designate corresponding parts in the various drawings, and wherein.

DETAILED DESCRIPTION OF THE PREFERRED EMBODIMENTS

Figure 4:
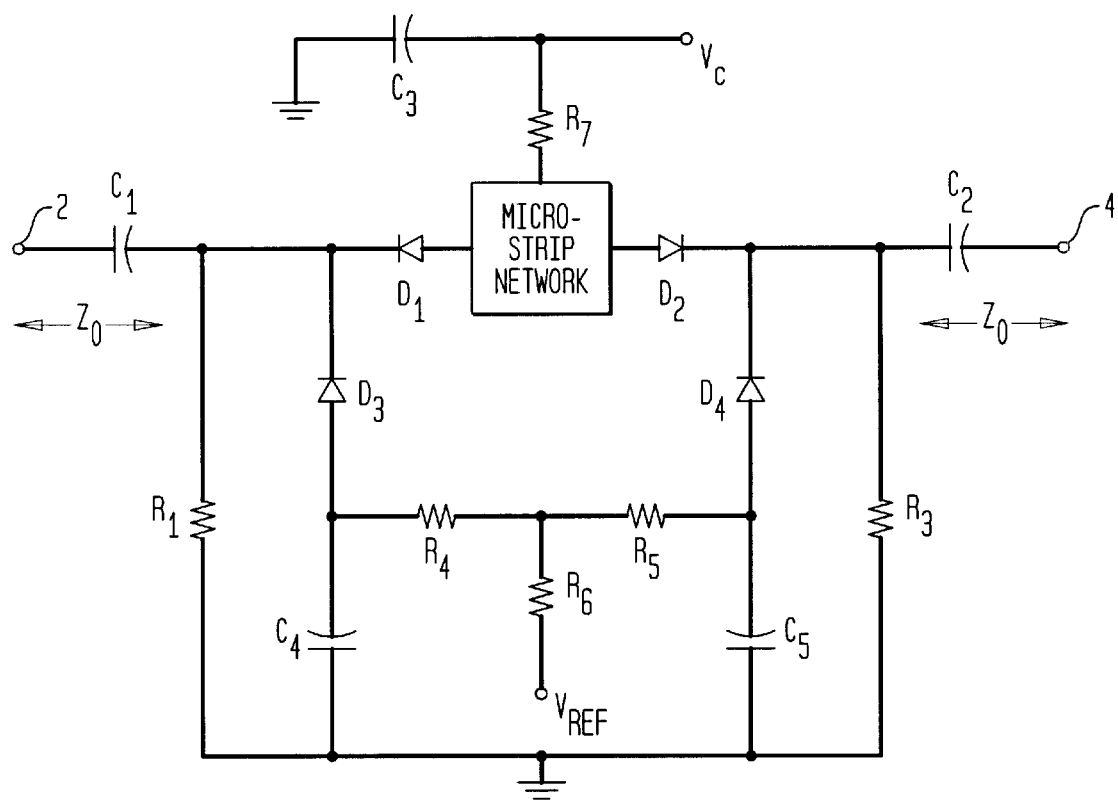
FIG. 4 illustrates a pi attenuator according to one embodiment of the present invention.

FIG. 4 illustrates one embodiment of a pi attenuator according to the present invention. As shown, FIG. 4 is the same as the prior art pi attenuator illustrated in FIG. 2 except that a microstrip network 10 has been connected between the anodes of the first and second diodes D1 and D2 and the seventh resistor R7 is connected to the microstrip network 10. The microstrip network 10 is a microstrip conductor having a width and electrical length that provides for input and output impedance matching.

Specifically, by reducing or increasing the microstrip conductor of the microstrip network 10, the impedance of the. microstrip network 10 changes with respect to the remainder of the attenuator, which is set at a desired characteristic impedance (e.g., 50 Ohms for communication systems or 75 Ohms for video and computer network systems). Increasing the width, decreases the impedance of the microstrip network 10, and decreasing the width increases the impedance of the microstrip network 10. Changing the electrical length of the microstrip network 10 changes the impedance of the attenuator because changing the electrical length changes the impedance transformation caused by the microstrip network 10.

Accordingly, for a given desired characteristic impedance, pi attenuator and operating frequency range, the impedance (i.e., width) and the electrical length of the microstrip network 10 to provide for acceptable input and output return loss (i.e., impedance matching) is empirically determined. For example, for the attenuator of FIG. 2, and impedance characteristic of 50 Ohms and an operating frequency range of 1.93–1.99 GHz, an empirically determined impedance of 28 Ohms and electrical length of 36 electrical degrees for the microstrip network 10 resulted in the performance shown in FIG. 5.

Figure 5:
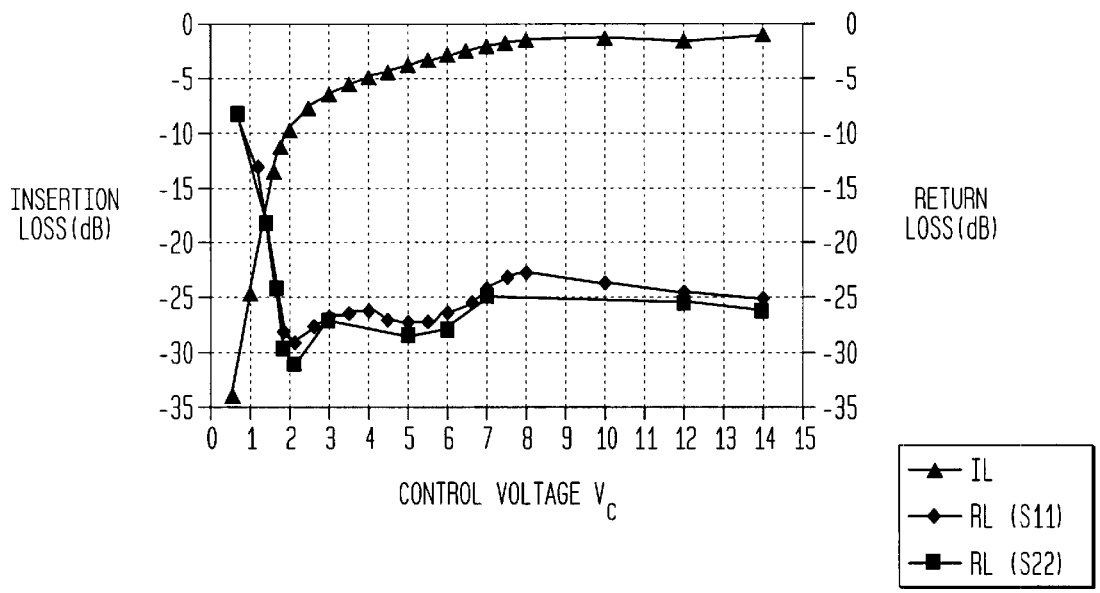
FIG. 5 illustrates the performance of the pi attenuator in FIG. 4 when operating over the 1.93 to 1.99 GHz frequency band.

As shown in FIG. 5, both input and output return loss is better than –20 dB over the entire 15 dB attenuation range from –1.5 dB to –16.5 dB. Additionally, the insertion loss flatness as a function of frequency ranges from 0.04 dB to a worst case of only 0.15 dB over the entire 15 dB attenuation range.

Figure 1:
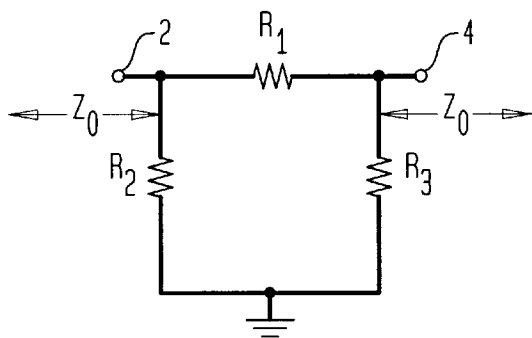
FIG. 1 illustrates a basic, prior art, pi fixed attenuator.
Figure 2:
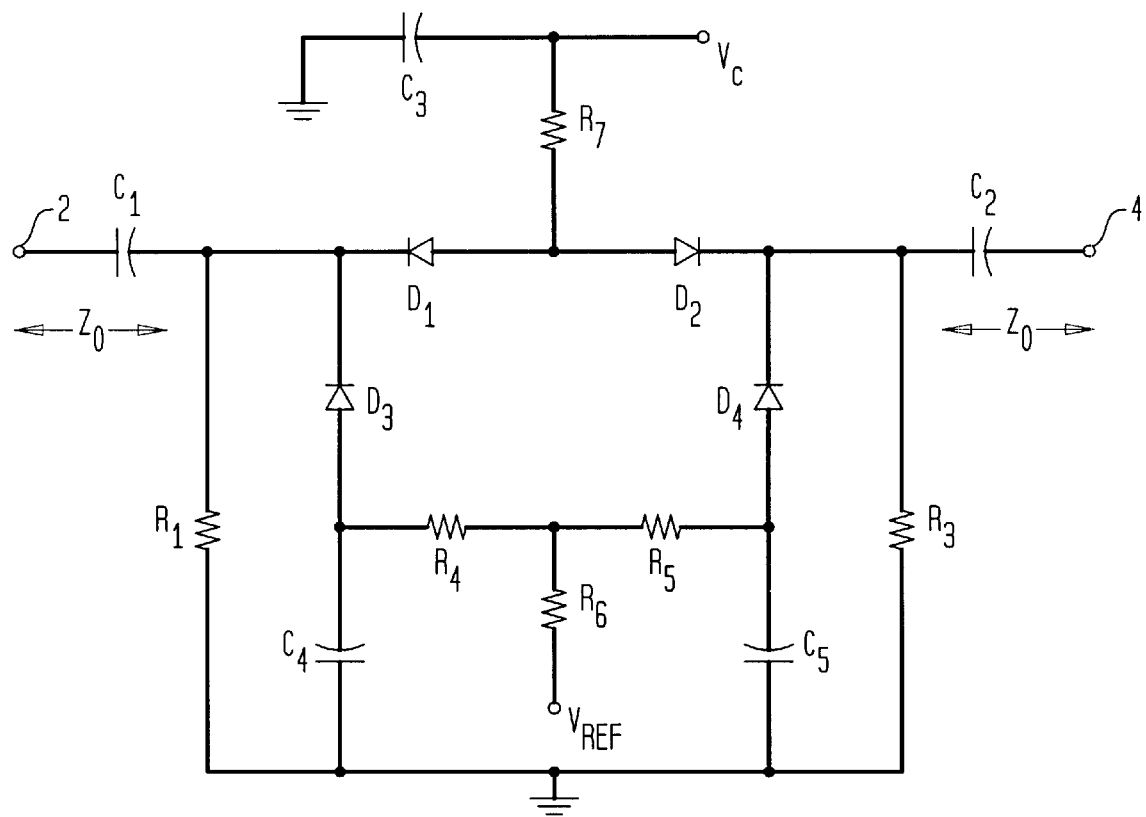
FIG. 2 illustrates another, prior art, pi attenuator that provides for variable attenuation.
Figure 3:
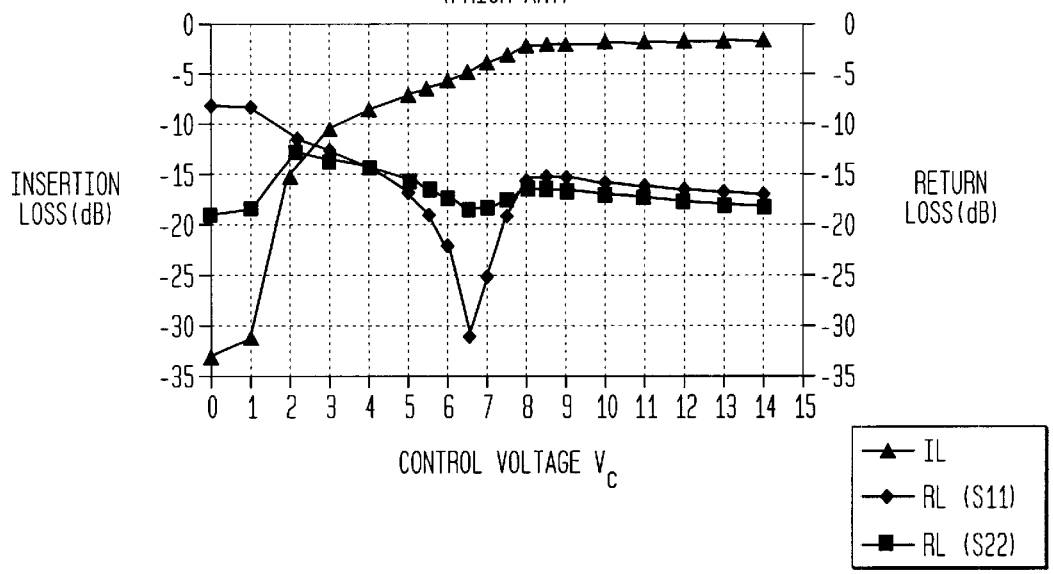
FIG. 3 illustrates the performance of the pi attenuator in FIG. 2 when operating over the 1.93 to 1.99 GHz frequency band.

As will be appreciated from the forgoing, the invention is not limited to the pi attenuator of FIG. 2, but is applicable to a variety of pi attenuators. Such variations are not to be regarded as a departure from the spirit and scope of the invention, and all such modifications are intended to be included within the scope of the following claims.

I claim:

1. An attenuator having a microstrip network connected in series between an input and an output of the attenuator, the microstrip network having a different impedance than a remainder of the attenuator and the microstrip network alone creating a substantial impedance match between the input and the output of the attenuator.

2. The attenuator of claim 1, wherein the attenuator functions as a pi attenuator.

3. The attenuator of claim 1, further comprising:

a series impedance connected between the input and the output;

a first shunt impedance connected to the input; and a second shunt impedance connected to the output.

4. The attenuator of claim 3, wherein the microstrip network forms part of the series impedance.

5. The attenuator of claim 3, wherein the series impedance includes at least one diode;

the first shunt impedance includes a diode; and the second shunt impedance includes a diode.

6. The attenuator of claim 5, wherein the microstrip network forms part of the series impedance.

7. The attenuator of claim 5, wherein the series impedance includes first and second diodes connected in series.

8. The attenuator of claim 7, wherein the microstrip network is connected between the first and second diodes.

9. The attenuator of claim 1, wherein the microstrip network has a predetermined width which differs from a width of microstrip conductors in the attenuator.

10. The attenuator of claim 9, wherein the microstrip network is wider than the microstrip conductors.

11. The attenuator of claim 9, wherein the microstrip network has a smaller width than the microstrip conductors.

12. The attenuator of claim 9, wherein the microstrip network has a predetermined electrical length.

13. The attenuator of claim 1, wherein the microstrip network has a predetermined electrical length.

* * * * *